(12) United States Patent
Chae et al.

(10) Patent No.: US 10,580,691 B2
(45) Date of Patent: Mar. 3, 2020

(54) METHOD OF INTEGRATED CIRCUIT FABRICATION WITH DUAL METAL POWER RAIL

(71) Applicant: Tokyo Electron Limited, Minato-ku, Tokyo (JP)

(72) Inventors: Soo Doo Chae, Albany, NY (US); Kaoru Maekawa, Albany, NY (US); Jeffrey Smith, Albany, NY (US); Nicholas Joy, Albany, NY (US); Gerrit J. Leusink, Albany, NY (US); Kai-Hung Yu, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 69 days.

(21) Appl. No.: 16/001,695

(22) Filed: Jun. 6, 2018

(65) Prior Publication Data

US 2018/0350665 A1    Dec. 6, 2018

Related U.S. Application Data

(60) Provisional application No. 62/515,968, filed on Jun. 6, 2017.

(51) Int. Cl.
*H01L 21/768* (2006.01)
*H01L 23/528* (2006.01)
*H01L 23/522* (2006.01)
*H01L 23/532* (2006.01)

(52) U.S. Cl.
CPC .. *H01L 21/76816* (2013.01); *H01L 21/76843* (2013.01); *H01L 21/76847* (2013.01); *H01L 21/76877* (2013.01); *H01L 23/5226* (2013.01); *H01L 23/5283* (2013.01); *H01L 23/5286* (2013.01); *H01L 23/53209* (2013.01); *H01L 23/53223* (2013.01); *H01L 23/53238* (2013.01);

(Continued)

(58) Field of Classification Search
CPC ......... H01L 21/76816; H01L 21/76843; H01L 21/76877; H01L 23/5226; H01L 23/5283; H01L 23/5286; H01L 23/53209; H01L 53/53223; H01L 23/53238; H01L 23/53252; H01L 23/53266
See application file for complete search history.

(56) References Cited

U.S. PATENT DOCUMENTS

| | | | |
|---|---|---|---|
| 2007/0059919 A1* | 3/2007 | Ooka | H01L 21/76808 438/618 |
| 2008/0122109 A1* | 5/2008 | Yang | H01L 21/7682 257/774 |
| 2017/0200642 A1* | 7/2017 | Shaviv | H01L 21/76843 |

* cited by examiner

*Primary Examiner* — Fernando L Toledo
*Assistant Examiner* — Neil R Prasad (57) ABSTRACT

A substrate processing method is provided for metal filling of recessed features in a substrate. According to one embodiment, the method includes providing a substrate containing horizontally spaced nested and isolated recessed features, filling the nested and isolated recessed features with a blocking material, and performing in any order: a) sequentially first, removing the blocking material from the nested recessed features, and second, filling the nested recessed features with a first metal, and b) sequentially first, removing the blocking material from the isolated recessed features, and second, filling the isolated recessed features with a second metal that is different from the first metal. According to one embodiment, the first metal may include Ru metal and the second metal may include Cu metal. According to one embodiment, a microelectronic device containing metal filled recessed features is provided.

19 Claims, 12 Drawing Sheets

(52) U.S. Cl.
CPC .. *H01L 23/53252* (2013.01); *H01L 23/53266* (2013.01)

METHOD OF INTEGRATED CIRCUIT FABRICATION WITH DUAL METAL POWER RAIL

CROSS-REFERENCE TO RELATED APPLICATIONS

This application is related to and claims priority to U.S. Provisional Patent Application Ser. No. 62/515,968 filed on Jun. 6, 2017, the entire contents of which are herein incorporated by reference.

FIELD OF THE INVENTION

This invention relates to methods for processing a substrate, and more particularly to a method of metal filling of recessed features for microelectronic devices.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal and interlayer dielectric layers that insulate the metal layers from each other.

The use of copper (Cu) metal in multilayer metallization schemes for manufacturing integrated circuits creates problems due to high mobility of Cu atoms in dielectrics, such as $SiO_2$, and Cu atoms may create electrical defects in Si. Thus, Cu metal layers, Cu filled trenches, and Cu filled vias are normally encapsulated with a barrier material to prevent Cu atoms from diffusing into the dielectrics and Si. Barrier layers are normally deposited on trench and via sidewalk and bottoms prior to Cu seed deposition, and may include materials that are preferably non-reactive and immiscible in Cu, provide good adhesion to the dielectrics and can offer low electrical resistivity.

An increase in device performance is normally accompanied by a decrease in device area or an increase in device density. An increase in device density requires a decrease in via dimensions used to form interconnects, including a larger aspect ratio (i.e., depth to width ratio). As via dimensions decrease and aspect ratios increase, it becomes increasingly more challenging to form diffusion barrier layers with adequate thickness on the sidewalls of the vias, while also providing enough volume for the metal layer in the via. In addition, as via and trench dimensions decrease and the thicknesses of the layers in the vias and trenches decrease, the material properties of the layers and the layer interfaces become increasingly more important. In particular, the processes forming those layers need to be carefully integrated into a manufacturable process sequence where good control is maintained for all the steps of the process sequence.

Void-less metal filling of recessed features for microelectronic devices has become increasingly more difficult as aspect ratios of the recessed features increase and new methods are needed that enable complete filing of the recessed features with low-resistivity metals.

SUMMARY OF THE INVENTION

A substrate processing method is provided for metal filling of recessed features in a substrate. Embodiments of the invention address problems with metal filling of fine recessed features with different feature widths.

According to one embodiment, the method includes providing a substrate containing horizontally spaced nested and isolated recessed features, filling the nested and isolated recessed features with a blocking material, and performing in any order: a) sequentially first, removing the blocking material from the nested recessed features, and second, filling the nested recessed features with a first metal; and b) sequentially first, removing the blocking material from the isolated recessed features, and second, filling the isolated recessed features with a second metal that is different from the first metal.

According to another embodiment, the method includes providing a substrate containing horizontally spaced nested and isolated recessed features, filling the nested recessed features with a first metal and partially fitting the isolated recessed features with the first metal, and filling the isolated recessed features with a second metal that is different from the first metal.

According to another embodiment, the method includes providing a substrate; and performing in any order: a) sequentially first, forming nested recessed features in the substrate, and second, filling the nested recessed features with a first metal, and b) sequentially first, forming isolated recessed features that are horizontally spaced in the substrate from the nested features, and second, filling the isolated recessed features with a second metal that is different from the first metal.

According to one embodiment, a microelectronic device is provided. The microelectronic device includes a substrate containing horizontally spaced nested and isolated recessed features, where the nested recessed features are filled with a first metal and the isolated recessed features are filled with a second metal that is different from the first metal.

According to another embodiment, the microelectronic device includes a substrate containing horizontally spaced nested and isolated recessed features, where the nested recessed features are filled with a first metal, and the isolated recessed features are filled with the first metal and a second metal, and wherein the second metal is different from the first metal and overlies the first metal in the isolated recessed features.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Embodiments of the invention address metal filling of fine recessed features found in microelectronic devices. In one example, the horizontally spaced recessed features may be grouped into a plurality of recessed feature groups according to their feature widths (feature opening dimension). Recessed features on a substrate are often referred to nested recessed features and isolated recessed features, where the nested recessed features have a high horizontal density and small feature openings, and isolated recessed features that have low horizontal density and large feature widths. For example, the nested recessed features can have feature openings that are smaller than a predetermined value, and the isolated recessed features can have feature openings that are greater than the predetermined value. The predetermined value can, for example, be about 30 nm, about 40 nm, about 50 nm, about 60 nm, about 70 nm, about 80 nm, about 90 nm, about 100 nm, about 120 nm, or about 150 nm. In some examples, the nested recessed features can have feature widths that are less than about 50 nm, less than about 30 nm, less than about 20 nm, or less than about 10 nm. In some examples, the isolated recessed features can have feature widths that are greater than about 70 nm, greater than about 100 nm, greater than about 150 nm, or greater than 200 nm. In one non-limiting example, nested recessed features may have feature widths of less than about 20 nm and isolated recessed features may have feature widths of greater than about 50 nm. However, the feature widths for nested and isolated recessed features depend on the type of microelectronic device and the technology node.

Figure 1:
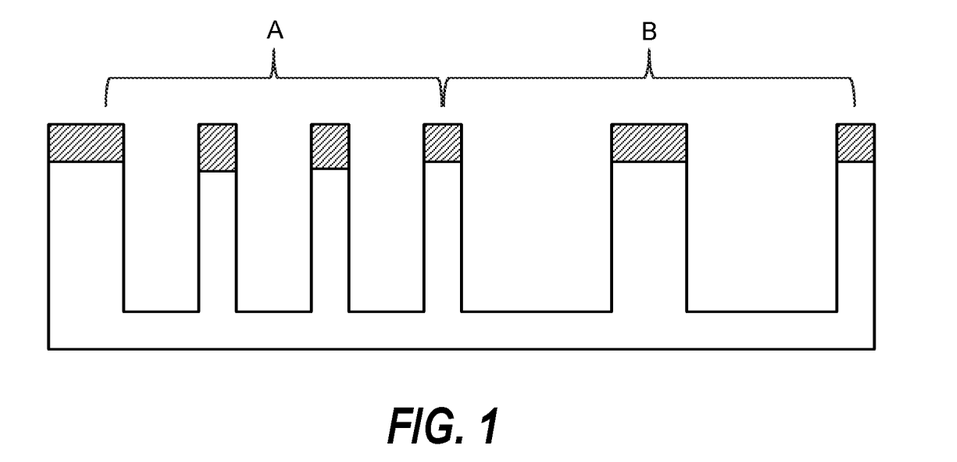
FIG. 1 shows a cross-sectional view of a patterned substrate containing a first group of nested recessed features (A) and a second group of isolated recessed features (B)

FIG. 1 shows a cross-sectional view of a patterned substrate containing a first group of nested recessed features (A) and a second group of isolated recessed features (B). The nested and isolated recessed features may be formed using well-known lithography and etching processes.

Metal filling of recessed features with different feature widths (e.g., nested and isolated recessed features) poses several problems in semiconductor manufacturing as microelectronic devices contain increasingly smaller features. Firstly, nested recessed features will be fully filled with metal before the isolated recessed features since less metal is needed to fully fill the nested recessed features than the isolated recessed features. This can create the formation of a metal overburden (excess metal) above the nested recessed features before the isolated features are filled. Secondly, traditional Cu metal filling can create unacceptable voids in very fine recessed features. Thirdly, many low resistivity metals that may be used to replace Cu metal filling are very expensive and thus can significantly increase the cost of the microelectronic device. Embodiments of the invention address these and other problems with metal filling of fine recessed features.

FIGS. 2A-2F schematically shows through cross-sectional views a method of processing a substrate according to an embodiment of the invention. The method includes providing a substrate containing horizontally spaced nested and isolated recessed features, filling the nested and isolated recessed features with a blocking material, and performing in any order: a) sequentially first, removing the blocking material from the nested recessed features, and second, filling the nested recessed features with a first metal; and b) sequentially first, removing the blocking material from the isolated recessed features, and second, filling the isolated recessed features with a second metal that is different from the first metal.

Figure 2A:
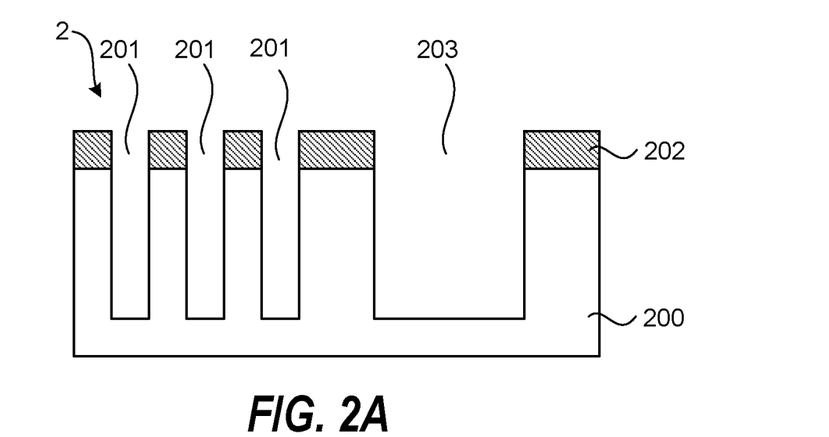
FIGS. 2A-2F schematically shows through cross-sectional views a method of processing a substrate according to an embodiment of the invention.

FIG. 2A shows a patterned substrate 2 that contains a first layer 200, a second layer 202 on the first layer 200, nested recessed features 201, and isolated recessed features 203. Only one isolated recessed feature 203 is shown but embodiments of the invention may be applied to a plurality of isolated recessed features 203.

According to embodiments of the invention, the first layer 200 may include any material layer found in microelectronic devices, including Si, $SiO_2$, SiN, a high-k material, a low-k material, or a metal-containing material. The second layer 202 may include a patterned mask layer.

Figure 2B:
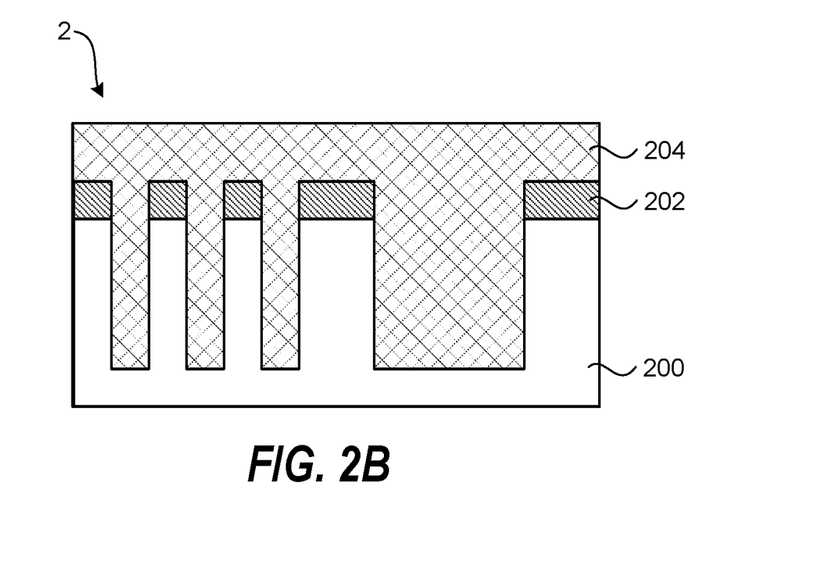

FIG. 2B shows a blocking material 204 that is deposited to fill the nested recessed features 201 and the isolated recessed features 203. The blocking material 204 can, for example, include $SiO_2$, SiN, Si, an organic dielectric layer (ODL), amorphous carbon, spin-on hardmasks (SOH), and metal oxides. The blocking material 204 may be selected in view of ease of filling the recessed features and later removal from the recessed features. The blocking material may be deposited on the patterned substrate 2 using various deposition methods, including liquid spin-on, atomic layer deposition (ALD), chemical vapor deposition (CVD), physical vapor deposition (PVD), and super-fill which preferentially deposits the blocking material into the recessed features until they are fully filled. As shown in FIG. 2B, the blocking material 204 may overfill the nested recessed features 201 and the isolated recessed features 203.

Figure 2C:
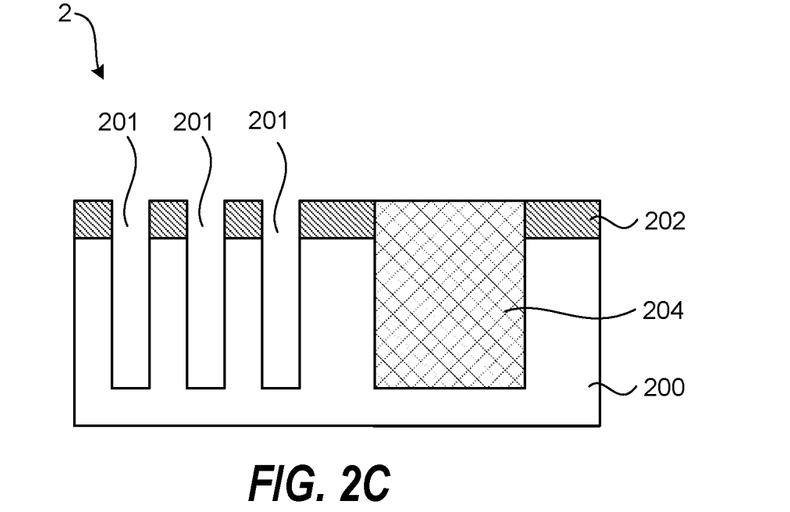

As shown in FIG. 2C, the blocking material 204 may be planarized on the patterned substrate 2, and thereafter removed from the nested recessed features 201, for example by forming a patterned mask layer on the blocking material 204 above the isolated recessed features 203, and etching the blocking material 204 from the nested recessed features 201.

Figure 2D:
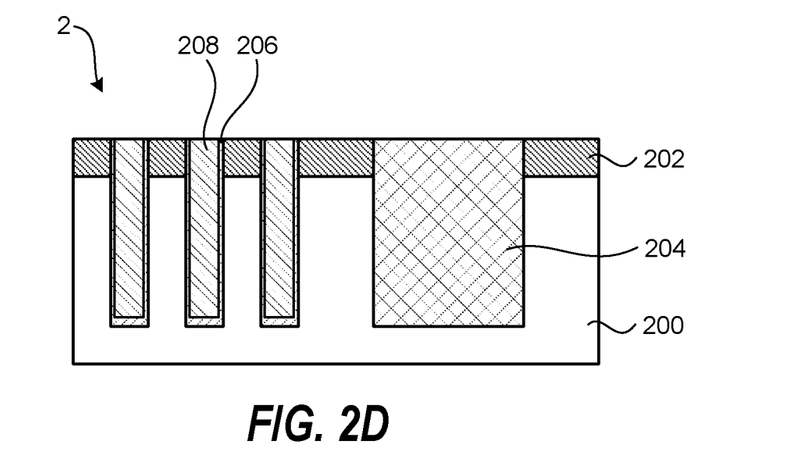

Thereafter, as shown in FIG. 2D, the open nested recessed features 201 are filled with a first metal 208 (e.g., Ru metal), where the blocking material 204 prevents deposition of the first metal 208 in the isolated recessed features 203. A conformal diffusion barrier layer 206 (e.g., TaN) may be deposited in the nested recessed features 201 prior to the deposition of the blocking material 204 or prior to deposition of the first metal 208. The patterned substrate 2 may be re-planarized to remove excess first metal 208.

Figure 2E:
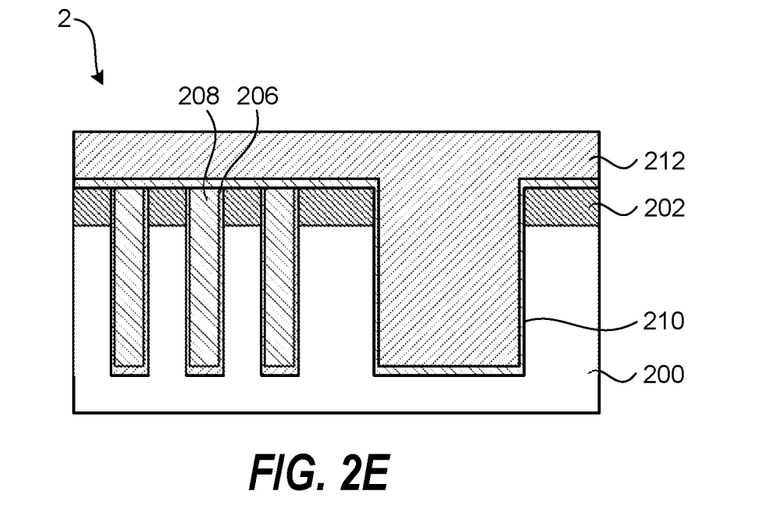
Figure 2F:
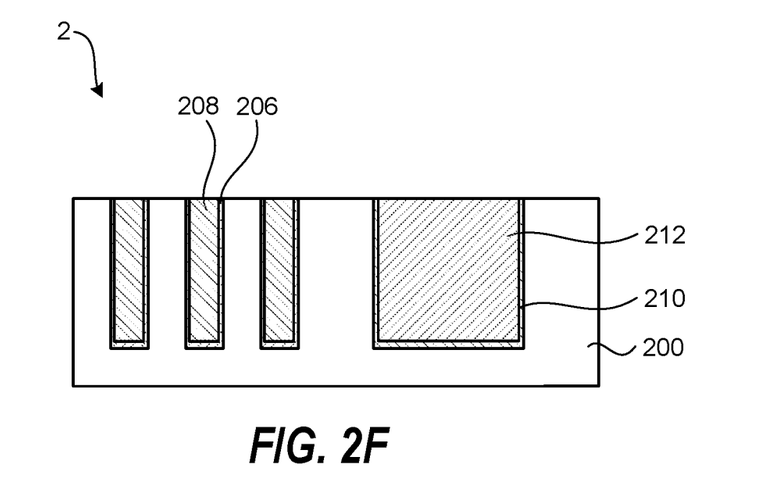

Following filling of the nested recessed features 201 with the first metal 208, the blocking material 204 is removed from the isolated recessed features 203 and the isolated recessed features 203 are filled with a second metal 212 (e.g., Cu metal). This is shown in FIG. 2E. A conformal diffusion barrier layer 210 (e.g., TaN) may be deposited in the isolated recessed features 203 prior to the deposition of the blocking material 204 or prior to deposition of the second metal 212. Thereafter, as shown in FIG. 2F, any second metal 212 overburden, portion of the first metal 208, diffusion barrier layers 206 and 210, and second layer 202 may be removed in a planarization process that can include chemical mechanical planarization (CMP), gas phase etching (etch back), or both. The resulting planarized patterned substrate 2 contains nested recessed features filled with a first metal 208 and isolated recessed features 203 filled with a second metal 212 that is different from the first metal.

According to embodiments of the invention, the first metal 208 and the second metal 212 may be selected from the group consisting of Ru metal, Cu metal, Co metal, W metal, and Al metal. However, other transition metals may be used. According to one embodiment, the first metal 208 may include Ru metal and the second metal 212 may include Cu metal. The first metal 208 and the second metal 212 may, for example, be deposited by vapor phase deposition, including CVD or PVD. In one example, the first metal 208 and the second metal 212 may be deposited by super-fill deposition that is characterized by bottom up deposition in the recessed features. In one example, the first metal 208 that fills the nested recessed features 201 may be Ru metal that is deposited by CVD using $Ru_3(CO)_{12}$ gas and CO carrier gas. In one example, the second metal 212 that fills the isolated recessed features 203 may be Cu metal that is deposited by PVD. The use of the more expensive Ru metal in the narrow nested recessed features 201 and the use of the cheaper Cu metal in the wider isolated recessed features 203 can significantly decrease the cost of the microelectronic device. Further, Ru metal can have better filling properties than Cu metal in very fine recessed features such as the nested recessed features 201.

FIGS. 3A-3F schematically shows through cross-sectional views a method of processing a substrate according to an embodiment of the invention. The embodiment described in FIG. 3A-3F is similar to the embodiment described in FIGS. 2A-2F but the isolated recessed features 203 are filled first with the second metal 212, and thereafter the nested recessed features 201 are filled with the first metal 208. The patterned substrate 2 in FIGS. 2A and 2B has been reproduced as a patterned substrate 3 in FIGS. 3A and 3B, respectively.

Figure 3A:
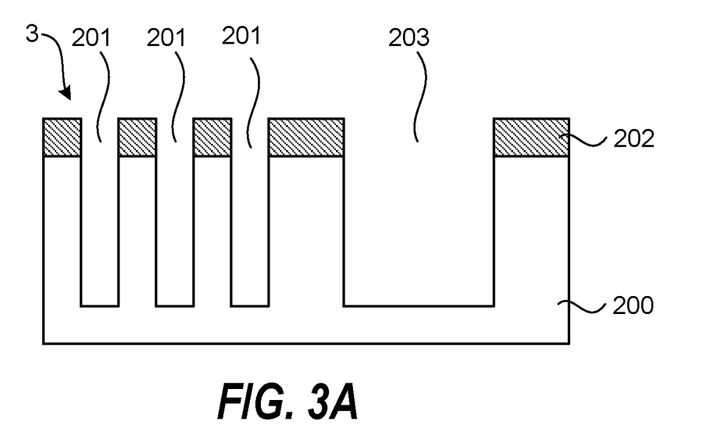
FIGS. 3A-3F schematically shows through cross-sectional views a method of processing a substrate according to an embodiment of the invention.
Figure 3B:
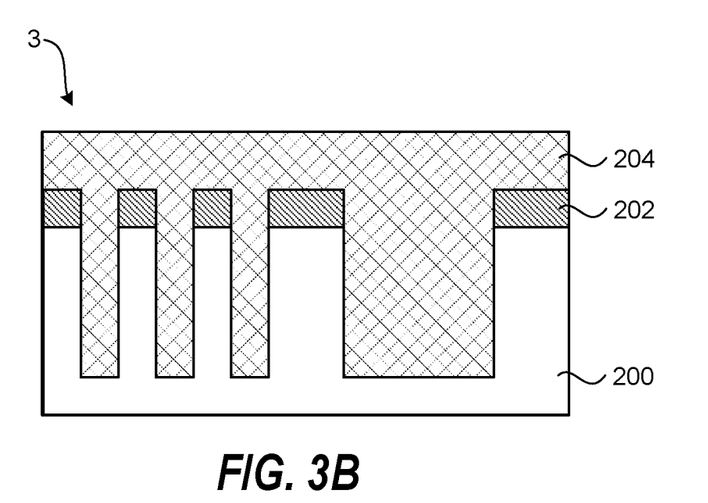

FIG. 3B shows a blocking material 204 that is deposited to fill the nested recessed features 201 and the isolated recessed features 203.

Figure 3C:
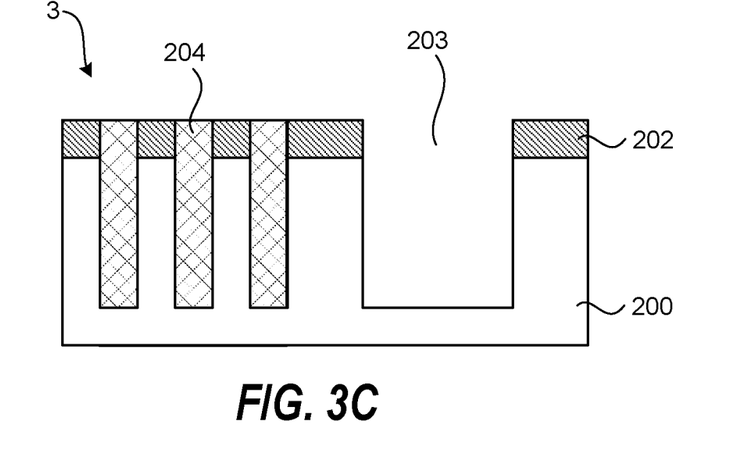

As shown in FIG. 3C, the blocking material 204 may be planarized on the patterned substrate 3, and thereafter removed from the isolated recessed features 203, for example by forming a patterned mask layer on the blocking material 204 above the nested recessed features 201, and etching the blocking material 204 from the isolated recessed features 203.

Figure 3D:
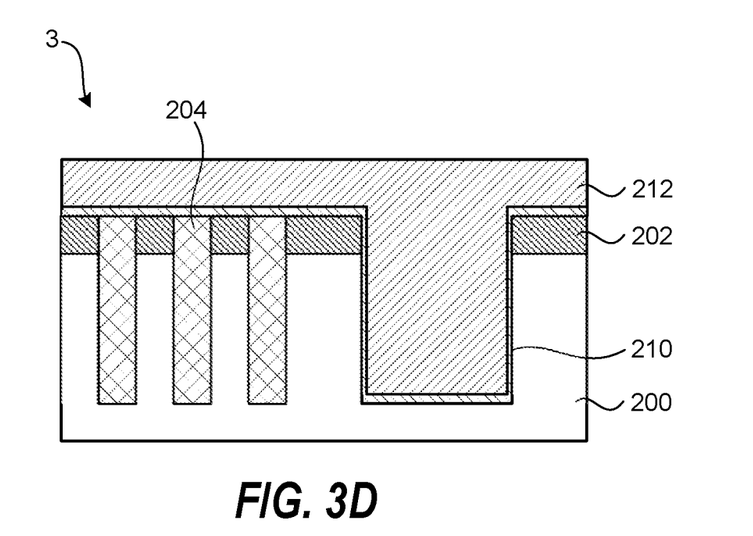

Thereafter, as shown in FIG. 3D, the open isolated recessed features 203 are filled with a second metal 212 (e.g., Cu metal), where the blocking material 204 prevents deposition of the second metal 212 in the nested recessed features 201. A conformal diffusion barrier layer 210 (e.g., TaN) may be deposited in the isolated recessed features 203 prior to the deposition of the blocking material 204 or prior to deposition of the second metal 212.

Figure 3E:
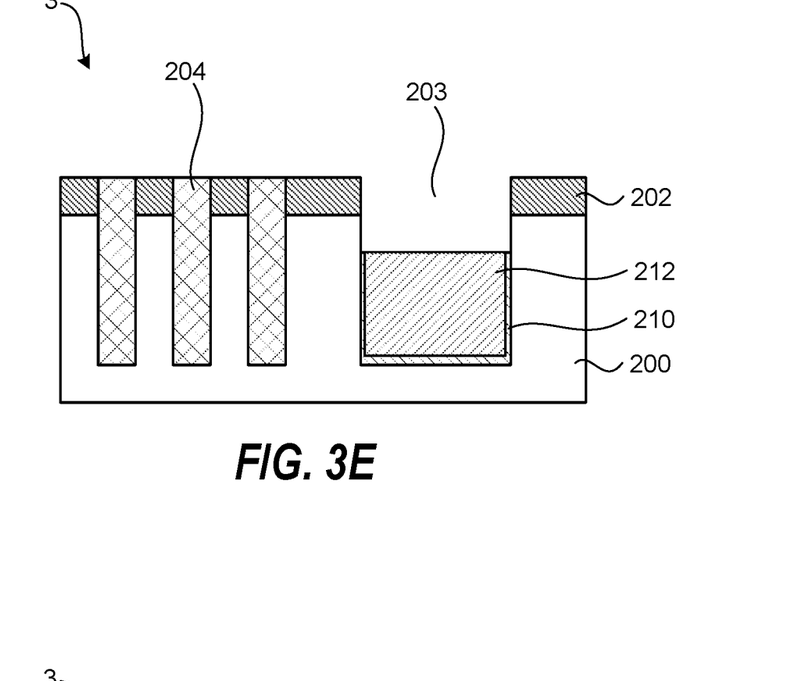

Thereafter, as shown in FIG. 3E, any second metal 212 overburden and diffusion barrier layer 210 may be removed in a planarization process that can include CMP, gas phase etching (etch back), or both. Further, the second metal 212 may be recessed in the isolated recessed features 203 using an etch-back process.

Figure 3F:
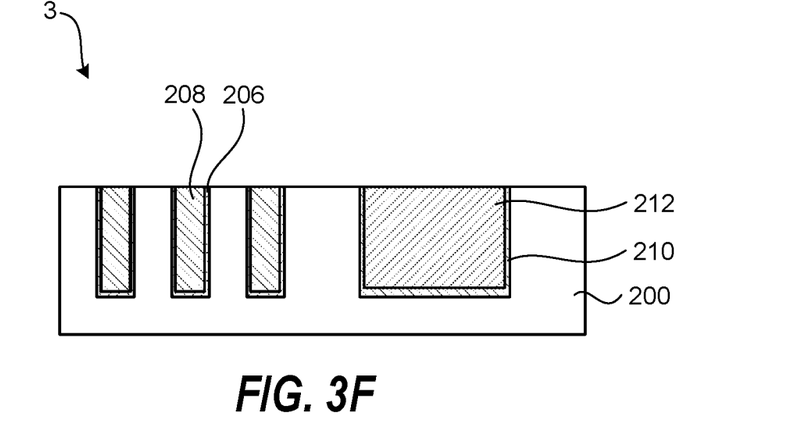

Thereafter, the blocking material 204 is removed from the nested recessed features 201 and the nested recessed features 201 are filled with a first metal 208 (e.g., Ru metal). A conformal diffusion barrier layer 206 (e.g., TaN) may be deposited in the nested recessed features 201 prior to the deposition of the blocking material 204 or prior to deposition of the first metal 208. This is shown in FIG. 3F. The resulting planarized patterned substrate 3 contains nested recessed features filled with a first metal 208 and isolated recessed features 203 filled with a second metal 212 that is different from the first metal.

FIGS. 4A-4F schematically shows through cross-sectional views a method of processing a substrate according to an embodiment of the invention. The patterned substrate 2 in FIG. 2A has been reproduced as a patterned substrate 4 in FIG. 4A. The embodiment described in FIGS. 4A-4F is similar to the embodiment described in FIGS. 2A-2F, but the method includes filling the nested recessed features 201 with the first metal 208 and the isolated recessed features 203 are partially filled with the first metal 208. This shown in FIG. 4B.

Figure 4A:
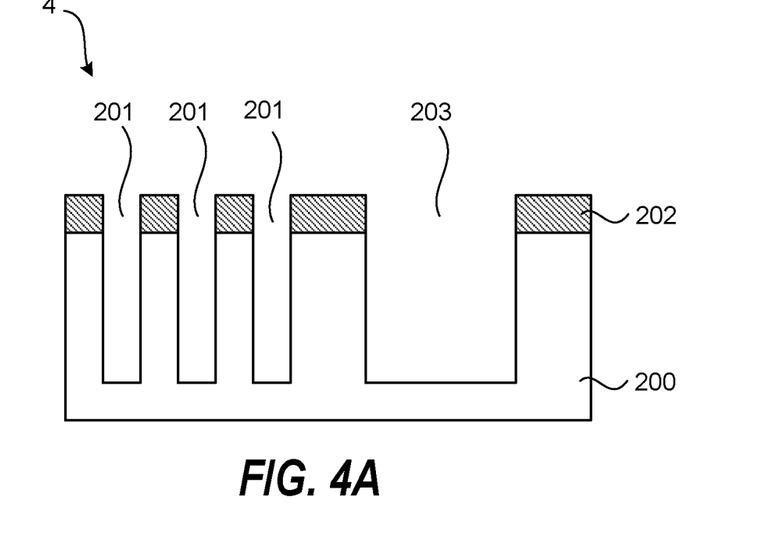
FIGS. 4A-4F schematically shows through cross-sectional views a method of processing a substrate according to an embodiment of the invention.
Figure 4B:
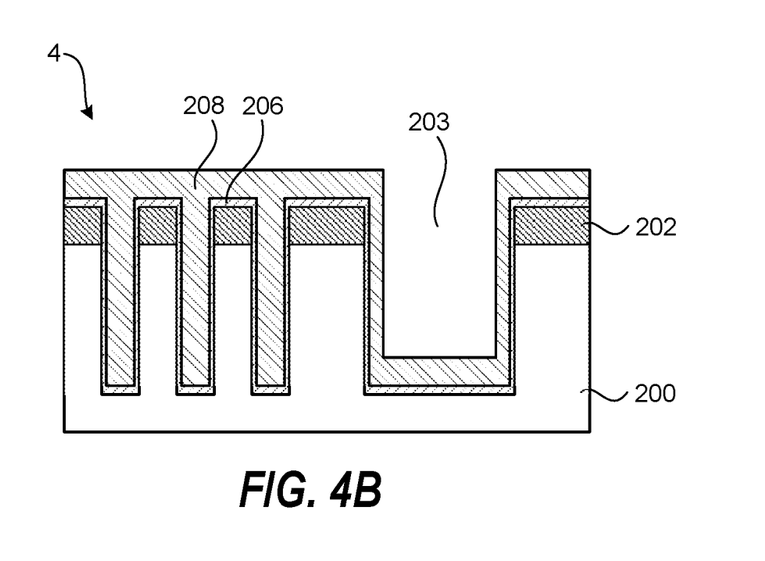
Figure 4C:
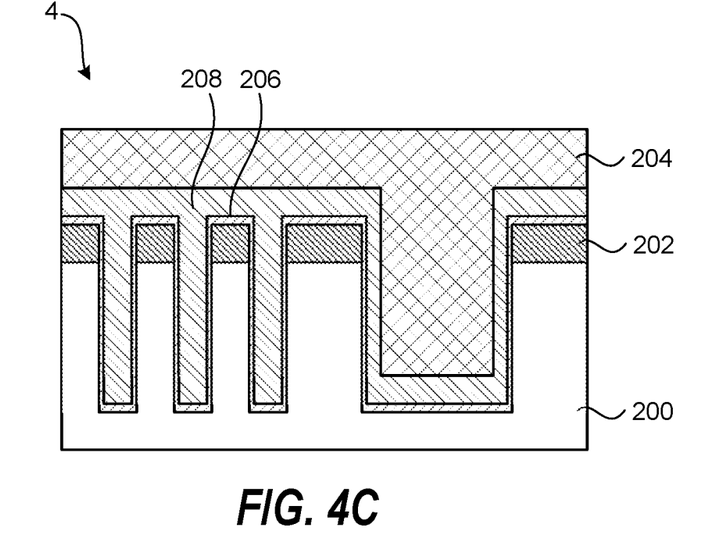

Thereafter, as shown in FIG. 4C, a blocking material 204 is deposited on the patterned substrate 4, where the blocking material 204 fully fills the partially filled isolated recessed features 203.

Figure 4D:
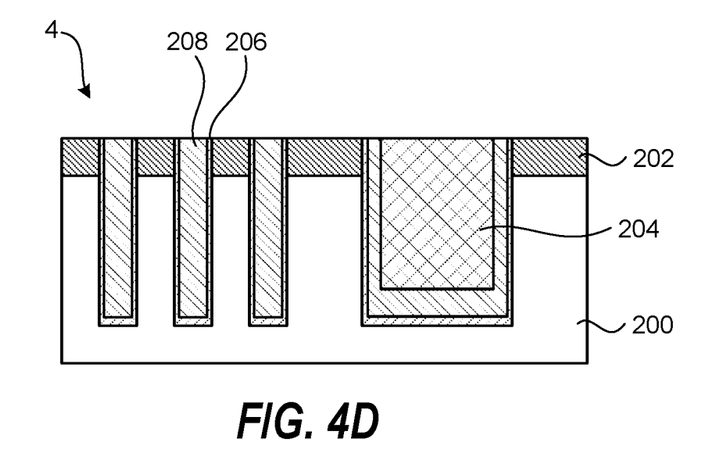

As shown in FIG. 4D, the patterned substrate 4 may be planarized, where the planarization removes any blocking material 204 overburden, portion of the first metal 208, and diffusion barrier layers 206 and 210. The planarization process that can include CMP, gas phase etching (etch back), or both.

Figure 4E:
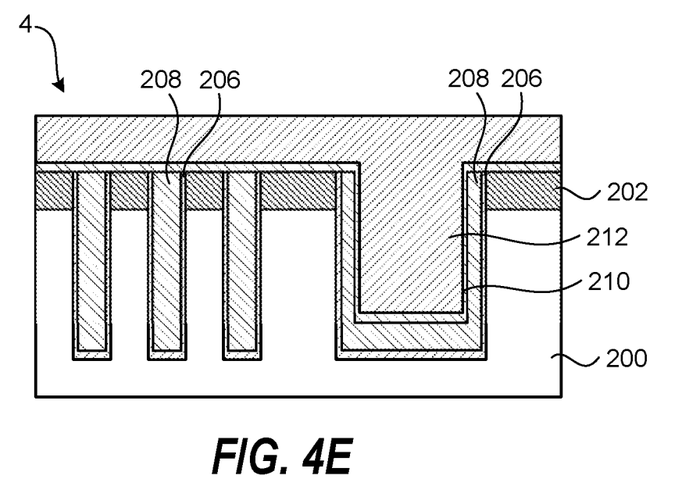

Thereafter, as shown in FIG. 4E, the blocking material 204 is removed from the isolated recessed features 203, and the isolated recessed features 203 are filled with a second metal 212. A conformal diffusion barrier layer 210 (e.g., TaN) may be deposited in the isolated recessed features 203 prior to deposition of the second metal 212.

Figure 4F:
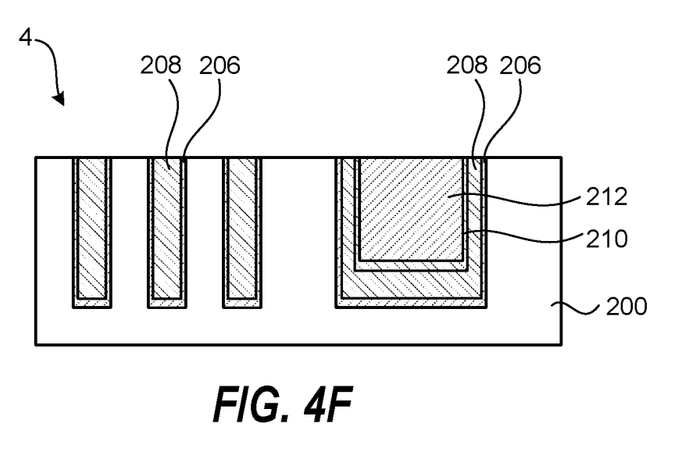

Thereafter, as shown in FIG. 4F, any second metal 212 overburden, portion of the first metal 208, diffusion barrier layers 206 and 210, and second layer 202 may be removed in a planarization process that can include CMP, gas phase etching, or both. The resulting substrate in FIG. 4F contains nested recessed features filled with a first metal 208 and isolated recessed features filled with the first metal 208 and the second metal 212 that is different from the first metal 208 and overlies the first metal 208 in the isolated recessed features 203.

Figure 5A:
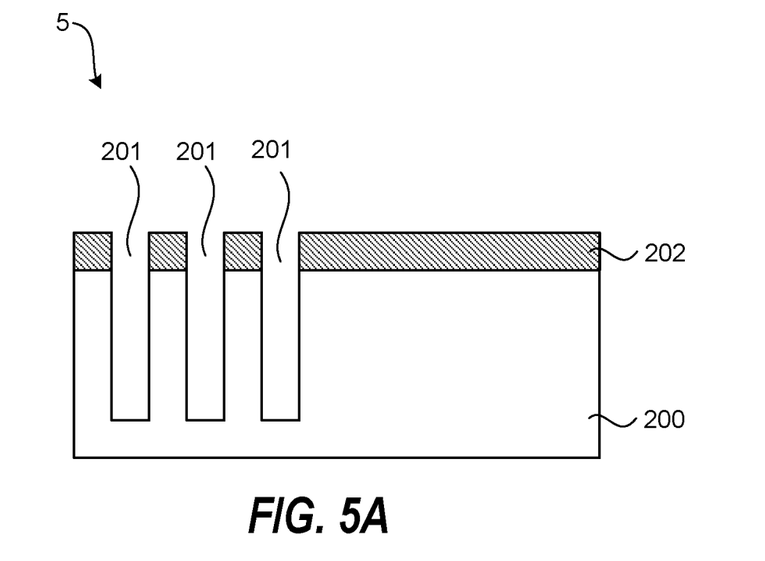
FIGS. 5A-5F schematically shows through cross-sectional views a method of processing a substrate according to an embodiment of the invention.

FIGS. 5A-5F schematically shows through cross-sectional views a method of processing a substrate according to an embodiment of the invention. FIG. 5A shows a patterned substrate 5 that contains a first layer 200, a second layer 202 on the first layer 200, and nested recessed features 201.

Figure 5B:
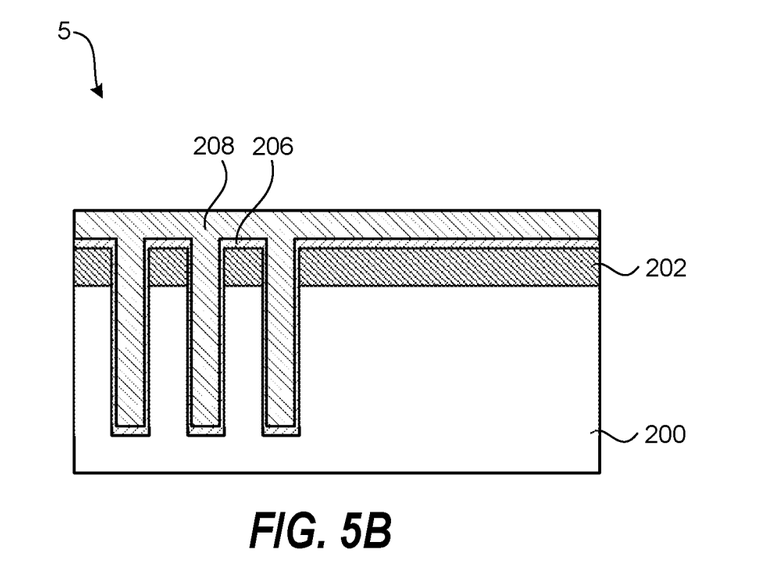
Figure 5C:
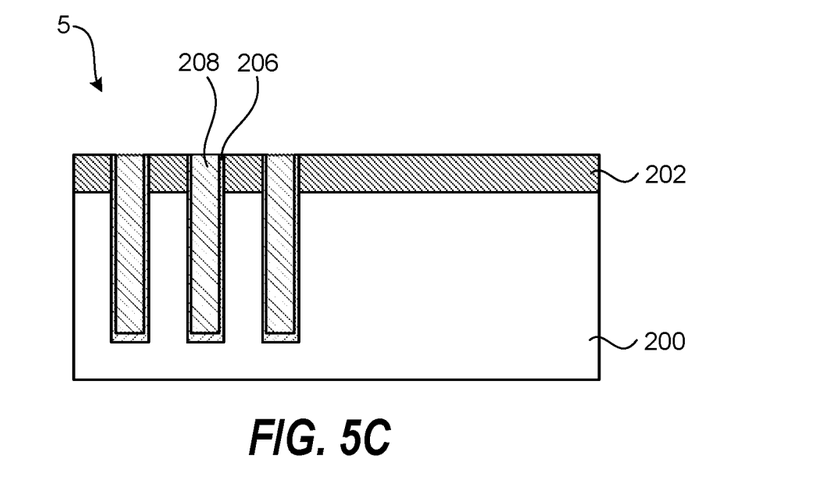
Figure 5D:
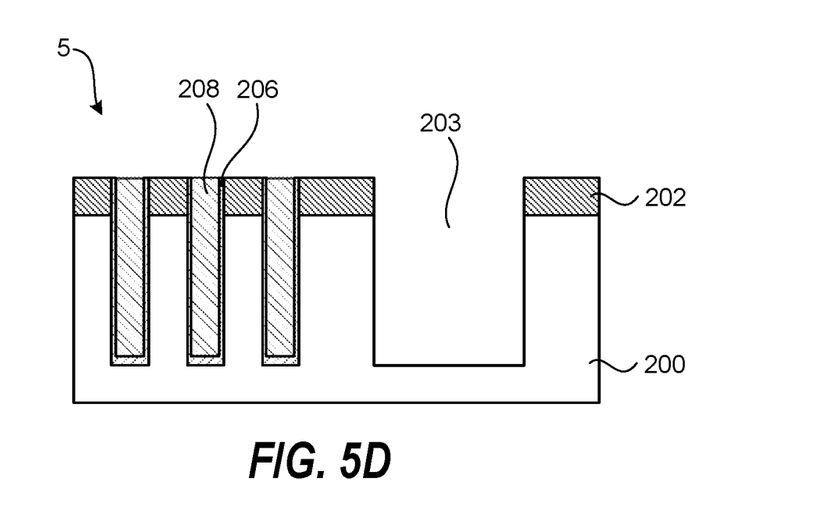
Figure 5E:
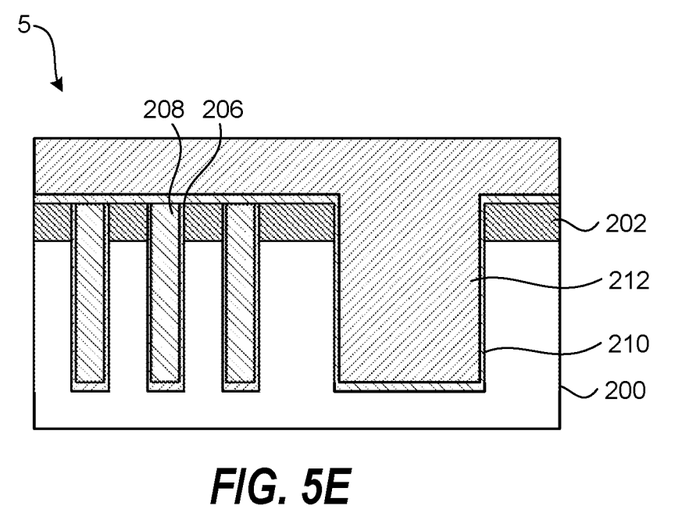

As shown in FIG. 5B, the open nested recessed features 201 are filled with a first metal 208 (e.g., Ru metal). A conformal diffusion barrier layer 206 (e.g., TaN) may be deposited in the nested recessed features 201 prior to the deposition of the first metal 208. As shown in FIG. 5C, any first metal 208 overburden and diffusion barrier layer 206 may be removed by planarization Thereafter, as shown in FIG. 5D, isolated recessed features 203 may be etched in the patterned substrate 5 using conventional lithography and etching. FIG. 5E shows the isolated recessed features 203 filled with a second metal 212. A conformal diffusion barrier layer 210 (e.g., TaN) may be deposited in the isolated recessed features 203 prior to deposition of the second metal 212.

Figure 5F:
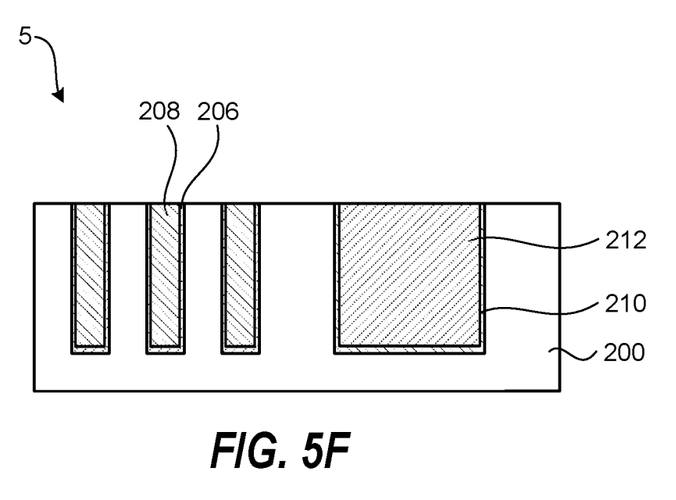

Thereafter, as shown in FIG. 5F, any second metal 212 overburden, portion of the first metal 208, diffusion barrier layers 206 and 210, and second layer 202 may be removed in a planarization process that can include CMP, gas phase etching, or both. The resulting planarized patterned substrate 5 contains nested recessed features filled with a first metal 208 and isolated recessed features 203 filled with a second metal 212 that is different from the first metal.

According to another embodiment, the order of metal filling the recessed features in FIGS. 5A-5F may be reversed. The process flow includes forming isolated recessed features 203 in the patterned substrate 5, filling the isolated recessed features 203 with a second metal 212 (e.g., Cu metal), forming nested recessed features 201 in the patterned substrate 5, filling the nested recessed features with a first metal 208 (e.g., Ru), and removing any first metal 208 overburden and any barrier layer in a planarization process.

A plurality of embodiments for methods of metal filling of recessed features for microelectronic devices have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of substrate processing, the method comprising:
   providing a substrate containing horizontally spaced nested and isolated recessed features;
   filling the nested and isolated recessed features with a blocking material; and
   performing in any order:
   a) sequentially first, removing the blocking material from the nested recessed features, and second, filling the nested recessed features with a first metal; and
   b) sequentially first, removing the blocking material from the isolated recessed features, and second, filling the isolated recessed features with a second metal that is different from the first metal.

2. The method of claim 1, wherein the nested recessed features have feature widths that are smaller than a predetermined value and the isolated recessed features have feature widths that are larger than the predetermined value.

3. The method of claim 1, wherein the first and second metals are selected from the group consisting of Ru metal, Cu metal, Co metal, W metal, and Al metal.

4. The method of claim 1, wherein the first metal includes Ru metal and the second metal includes Cu metal.

5. The method of claim 1, wherein the blocking materials includes $SiO_2$, SiN, Si, an organic dielectric layer (ODL), amorphous carbon, a spin-on hardmask (SOH), or a metal oxide.

6. The method of claim 1, wherein removing the blocking material from the nested and isolated nested recessed features includes a planarization process.

7. The method of claim 1, wherein b) is performed before a), the method further comprising recessing the second metal in the isolated recessed features before depositing the first metal.

8. A method of substrate processing, the method comprising:
   providing a substrate containing horizontally spaced nested and isolated recessed features;
   filling the nested recessed features with a first metal and partially filling the isolated recessed features with the first metal;
   filling the isolated recessed features with a blocking material;
   removing the first metal between the nested and isolated recessed features;
   removing the blocking material from the isolated recessed features; and
   filling the isolated recessed features with a second metal that is different from the first metal.

9. The method of claim 8, wherein the nested recessed features have feature widths that are smaller than a predetermined value and the isolated recessed features have feature widths that are larger than the predetermined value.

10. The method of claim 8, wherein the first and second metals are selected from the group consisting of Ru metal, Cu metal, Co metal, W metal, and Al metal.

11. The method of claim 8, wherein the first metal includes Ru metal and the second metal includes Cu metal.

12. The method of claim 8, wherein the blocking materials includes $SiO_2$, SiN, Si, an organic dielectric layer (ODL), amorphous carbon, a spin-on hardmask (SOH), or a metal oxide.

13. The method of claim 8, wherein removing the first metal includes a planarization process.

14. A method of substrate processing, the method comprising:
   providing a substrate; and
   performing in any order:
   a) sequentially first, forming nested recessed features in the substrate, and second, filling the nested recessed features with a first metal; and
   b) sequentially first, forming isolated recessed features that are horizontally spaced in the substrate from the nested features in the substrate, and second, filling the isolated recessed features with a second metal that is different from the first metal.

15. The method of claim 14, wherein the nested recessed features have feature widths that are smaller than a predetermined value and the isolated recessed features have feature widths that are larger than the predetermined value.

16. The method of claim 14, wherein the first and second metals are selected from the group consisting of Ru metal, Cu metal, Co metal, W metal, and Al metal.

17. The method of claim 14, wherein the first metal includes Ru metal and the second metal includes Cu metal.

18. The method of claim 14, wherein the blocking materials includes $SiO_2$, SiN, Si, an organic dielectric layer (ODL), amorphous carbon, a spin-on hardmask (SOH), or a metal oxide.

19. The method of claim 14, wherein the nested and isolated recessed features are horizontally spaced on the substrate.

* * * * *